(12) United States Patent
Wight et al.

(10) Patent No.: US 7,342,300 B2
(45) Date of Patent: Mar. 11, 2008

(54) INTEGRATED CIRCUIT INCORPORATING WIRE BOND INDUCTANCE

(75) Inventors: James Stuart Wight, Ottawa (CA); Johan M. Grundlingh, Kinburn (CA)

(73) Assignee: Zarbana Digital Fund LLC, Wilmington, DE (US)

( * ) Notice: Subject to any disclaimer, the term of this patent is extended or adjusted under 35 U.S.C. 154(b) by 0 days.

(21) Appl. No.: 10/610,497

(22) Filed: Jun. 30, 2003

(65) Prior Publication Data
US 2004/0266059 A1    Dec. 30, 2004

(51) Int. Cl.
H01L 21/44    (2006.01)
H01L 21/50    (2006.01)

(52) U.S. Cl. .............. 257/678; 257/531; 257/728; 257/784; 438/106; 438/381

(58) Field of Classification Search .............. 438/106, 438/381; 257/784, 691, 531
See application file for complete search history.

(56) References Cited

U.S. PATENT DOCUMENTS

| | | | |
|---|---|---|---|
| 3,854,100 A | 12/1974 | Pouzadoux | |
| 3,931,582 A | 1/1976 | Kato et al. | |
| 3,934,099 A | 1/1976 | Elder, Jr. | |
| 4,764,735 A | 8/1988 | Jones | |
| 4,924,195 A * | 5/1990 | Gonda | 331/116 R |
| 4,968,949 A | 11/1990 | Torrano et al. | |
| 5,563,762 A * | 10/1996 | Leung et al. | 361/301.4 |
| 5,612,647 A | 3/1997 | Malec | |
| 5,844,301 A * | 12/1998 | Van Roosmalen | 257/532 |
| 5,930,128 A | 7/1999 | Dent | |
| 6,107,684 A * | 8/2000 | Busking et al. | 257/725 |
| 6,166,971 A * | 12/2000 | Tamura et al. | 365/198 |
| 6,285,251 B1 | 9/2001 | Dent et al. | |
| 6,300,829 B1 | 10/2001 | Luu | |
| 6,304,137 B1 | 10/2001 | Pullen et al. | |
| 6,323,733 B1 | 11/2001 | Gorcea et al. | |
| 6,331,801 B1 | 12/2001 | Schmitt et al. | |
| 6,366,770 B1 * | 4/2002 | Seshita et al. | 455/277.1 |
| 6,603,352 B2 | 8/2003 | Wight | |
| 6,937,096 B2 | 8/2005 | Wight et al. | |

OTHER PUBLICATIONS

PCT/CA02/01847 International Search Report, Feb. 4, 2004, 3 pages.
PCT/CA02/01847 International Preliminary Examination Report, Apr. 13, 2004, 5 pages.

* cited by examiner

*Primary Examiner*—Michael Trinh
(74) *Attorney, Agent, or Firm*—Stolowitz Ford Cowger LLP

(57) ABSTRACT

The invention relates to the field of electronics, more particularly to the wire bonds incorporated into an integrated circuit package such as a quad flat pack, a ball grid array or hybrid style module. The present invention takes the normally undesirable wire bond inductance and uses it in an operational circuit where positive inductance is required. The circuit in which the wire bond inductance is used is located primarily in the integrated circuit die housed in the integrated circuit package, but may also include off-die components. In one example, a wire bond is used as the required series inductance in a discrete circuit impedance inverter which consists of two shunt-to-ground negative inductances and one series positive inductance. One of the negative inductances is located on-die, while the other is located off-die.

20 Claims, 3 Drawing Sheets

INTEGRATED CIRCUIT INCORPORATING WIRE BOND INDUCTANCE

BACKGROUND OF THE INVENTION

1. Field of the Invention

The invention relates to the field of electronics, more particularly to the wire bonds incorporated into an integrated circuit package.

2. Description of the Related Prior Art

As will be understood by those skilled in the art, an integrated circuit (IC), sometimes called a chip or microchip is a semiconductor material on which thousands of tiny resistors, capacitors, and transistors are fabricated in a particular configuration to perform a desired electronic function. For example, a chip can function as an amplifier, oscillator, timer, counter, computer memory or microprocessor. A particular chip is categorized as either digital or analogue, depending on its intended application.

In the manufacture of a chip a semiconductor wafer (typically 300 mm diameter for silicon) is doped to enhance its electron transfer properties and then etched to provide the desired circuitry. The resulting wafer is diced using scribing tools into dies or chips. The end product is delicate in nature so is incorporated into some form of packaging. Lower quality packages are plastic while higher quality packages are ceramic. The packaging serves a variety of functions, including: (a) physical protection of the chip; (b) the provision of electrical connectivity from the chip to the printed circuit board to which it is mounted; (c) dissipation of heat generated by the chip. Additionally, the electrical characteristics of the package itself are designed to minimally impact device performance.

Several well known packaging techniques have been developed, with two of the most popular being quad flat pack (QFP) and ball grid array (BGA). As shown in FIG. 1, a QFP package comprises a chip 10, which is protected using an epoxy resin 12. From the chip 10 extend wire bonds 14 (typically gold (Au)) which connect to leads 16 (typically lead/tin (Pb/Sn) plated) which may have silver spot plating at the contact point, as shown at 18. The leads 16 are connected (soldered) to a printed circuit board (not shown). An adhesive or solder 20 is used to adhere the chip to the carrier pad 22. FIG. 2 depicts a standard BGA package which comprises a chip 24, which is protected by an epoxy resin 26. From the chip 24 extend wire bonds 28 which connect to contacts 30 which extend through substrate or carrier pad 32 to electrical pads 34. The electrical pads 34 are connected to electrical pads 36 associated with printed circuit board 38, by way of solder balls 40. During manufacture, solder balls 40 are heated to provide a continuous electrical circuit between the chip 24 and printed circuit board 38. The chip 24 may be secured to the carrier pad 32 by means of a dielectric adhesive layer 42. FIG. 3 highlights the arrangement of the bottom of carrier pad 32 which consists of rows of electrical pads 34 extending around the perimeter. The "pitch" or distance between electrical contacts on chip 24, is typically smaller than the pitch between corresponding electrical pads 36 associated with printed circuit board 38. The integrated circuit package provides "tracks" to connect the small chip 24 pitch to the large printed circuit board 38 pitch.

As will also be appreciated, flip-chip assembly is an alternate packaging technique which can be used in a BGA-type assembly. As shown in FIG. 4, in this technique the chip 44 is actually flipped over to allow direct interconnections between the chip 44 and carrier pad 46 by way of solder balls 48. Electrical tracks (not shown) extending through carrier pad 46 to electrical pads 50 allow interconnection to printed circuit board 52 using a second series of solder balls 54. As can be seen in the figure, there are no wire bonds required. Although greater I/O density can be achieved using this packaging technique, problems such as controlling heat dissipation are prevalent making this technique unsuitable for some applications.

As highlighted above, the connection between the chip and the integrated circuit package can be achieved with flip-chip mounting inside the package (which is similar to the BGA between the package and the printed circuit board) or with wire bonds inside the package. Wire bonds are very short ribbons of wire, that are pressure welded from the chip pads to the package pads by machine. As will be appreciated by those in the art, a problem with wire bonds for high frequency circuits is that they also generate a small amount of inductance (e.g. 1 nanoHenry/millimetre of length). As those skilled in the art are aware, inductance is the characteristic of an electrical conductor which opposes a change in current flow. In the case of a wire bond, the inductance is often unpredictable because, typically, the exact length of the wire is inconsistent, as well as its location and termination point on either the chip or carrier pad. Both of these factors (and to some extent the thickness of the wire) affect its inherent inductance. The inconsistencies are largely a result of imprecise manufacturing techniques. As a result, this heretofore undesirable property of wire bonds has presented problems to integrated circuit designers who have tried to design around the inductance produced by wire bonds.

Where an inductor is required in one of the chip's operational circuits, it has heretofore been incorporated into the chip design itself (e.g. as a spiral inductor) and located on the chip ("on-die") or in the package or printed circuit board ("off-die"). In either case, recognized problems are created for the circuit designer.

In light of the problems and deficiencies of wire bonds highlighted above, there is a need for an improved integrated circuit package in which the wire bond inductance is advantageously used to facilitate operation of the chip.

SUMMARY OF THE INVENTION

It is therefore the primary object of the present invention to take the normally undesirable wire bond inductance and use it in an operational circuit where positive inductance is required. The circuit in which the wire bond inductance is used is located primarily in the integrated circuit die housed in the integrated circuit package, but may also include off-die components. In one example, at least one wire bond is used as the required series inductance in a discrete circuit impedance inverter which consists of two shunt-to-ground negative inductances and one series positive inductance. One of the negative inductances is located on-die, while the other is located off-die.

In accordance with one aspect of the invention there is provided an integrated circuit package comprising: an integrated circuit die having at least one circuit etched thereon; and a housing containing said integrated circuit die, wherein said integrated circuit die is electrically coupled to said housing using at least one wire bond; and wherein said wire bond(s) has (have) an inductance associated therewith; and wherein said wire bond inductance is used to facilitate operation of said at least one circuit.

In accordance with another aspect of the invention there is provided a method of providing inductance to facilitate operation of a circuit contained in an integrated circuit package, the method comprising the step of making available wire bond inductance to said circuit.

In accordance with yet another aspect of the invention there is provided use of wire bond inductance in an integrated circuit package to facilitate operation of a circuit contained in an integrated circuit package.

The advantage of the present invention are readily apparent. Instead of being a problem which a designer must try to overcome the inductance inherent in wire bonds can be utilized as an integral component of a functional circuit on the chip.

BRIEF DESCRIPTION OF THE DRAWINGS

A better understanding of the invention will be obtained by considering the detailed description below, with reference-to the following drawings in which.

DETAILED DESCRIPTION OF THE PREFERRED EMBODIMENT

In essence, the invention takes advantage of a physical property of a wire bond which had previously been considered undesirable. As a result of the advancement of manufacturing techniques the bond wires and ribbons can be made of a consistent length and bonded to electrical contacts on the package with sufficient precision to ensure that the inductance associated with the wire bond is predictable and therefore useable.

Figure 1:
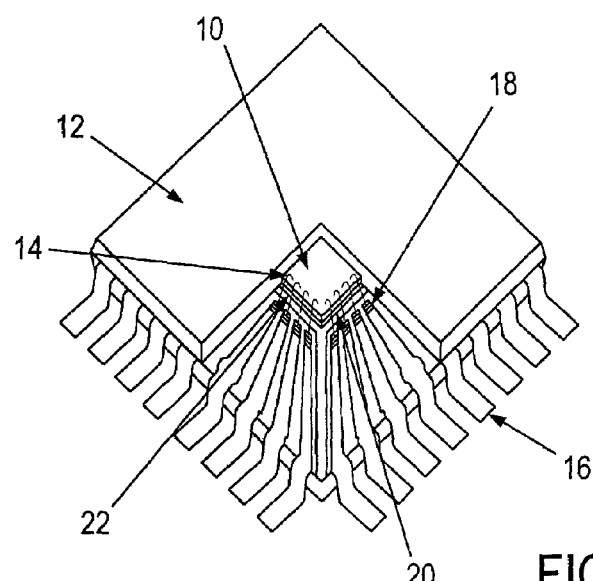
FIG. 1 provides a perspective view of an integrated circuit package of the quad flat pack type.
Figure 2:
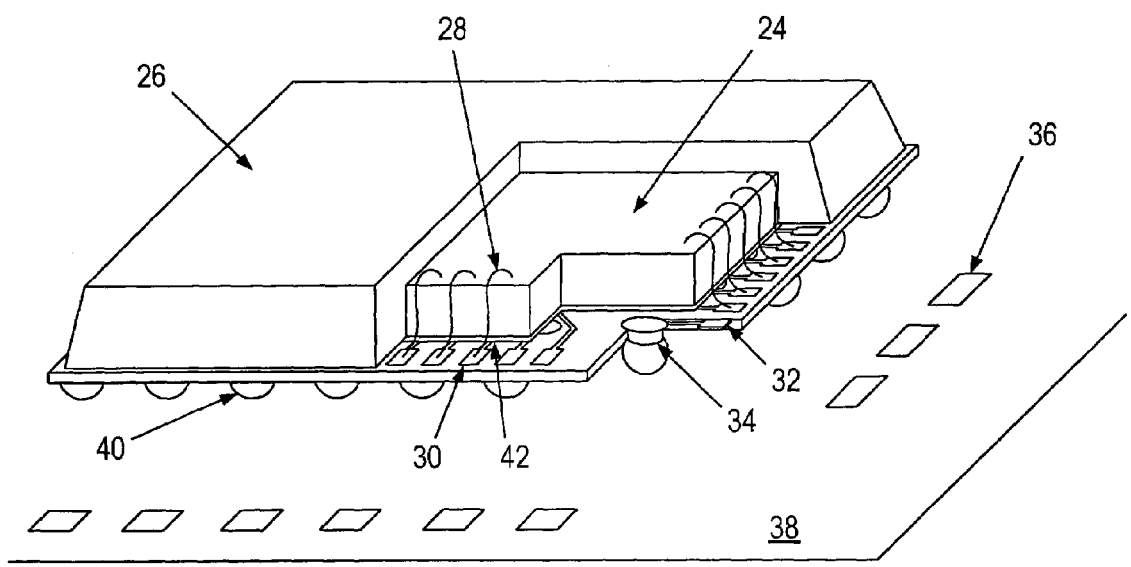
FIG. 2 provides a perspective view of an integrated circuit package of the ball grid array type.
Figure 3:
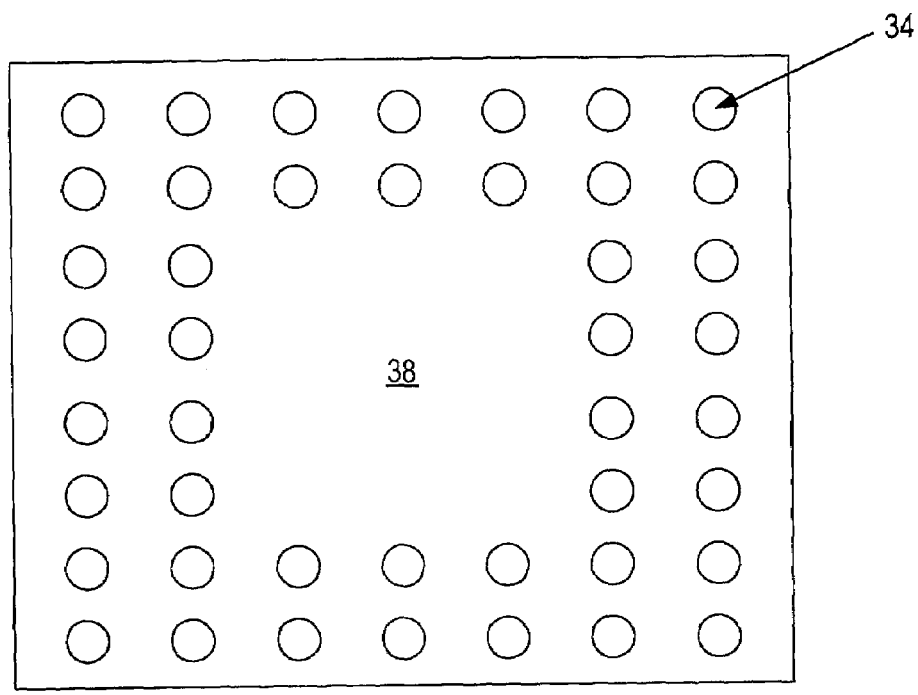
FIG. 3 provides a bottom view of the integrated circuit package of FIG. 2.
Figure 4:
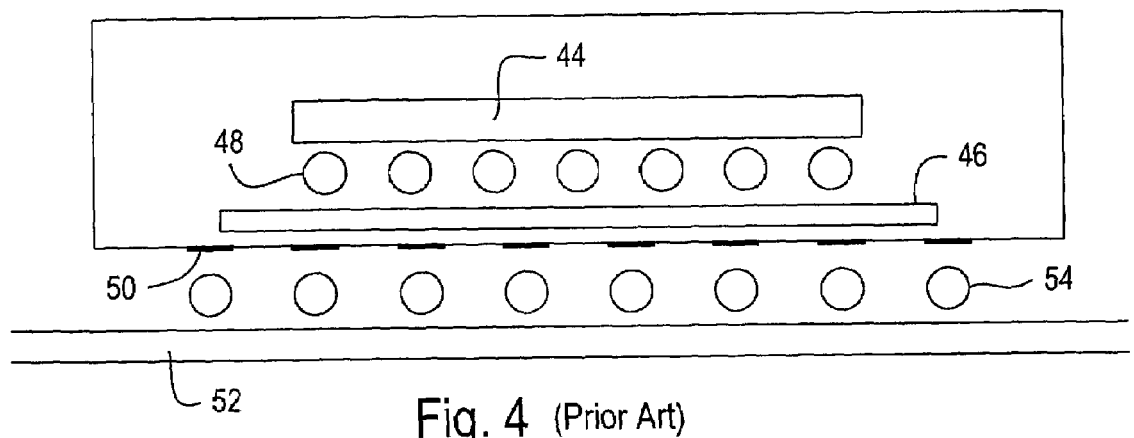
FIG. 4 depicts an integrated circuit package of the flip-chip assembly type.
Figure 5:
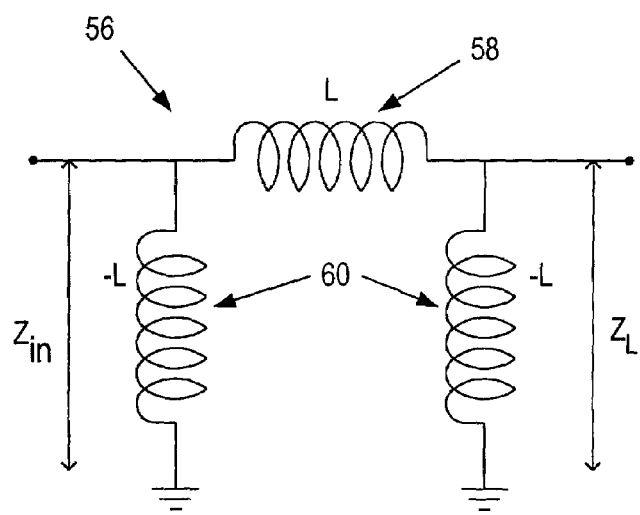
FIG. 5 depicts a lumped element impedance inverter in which wire bond inductance is utilized.

FIG. 5 depicts a lumped element impedance inverter 56. As those skilled in the art will appreciate, impedance is the total opposition to the flow of alternating current in a circuit that contains resistance and reactance. In the case of pure inductance, inductive reactance is the total opposition to the flow of current through it. An impedance inverter serves to transform a low output impedance to a high output impedance. As shown in the figure, the lumped element impedance inverter 56 consists of a series (positive) inductor 58 (also labelled "L") and two shunt negative inductances 60 (also labelled "−L"). Through the use of this impedance inverter, a load impedance $Z_L$ is transformed into an input impedance $Z_{in}=\omega^2 L^2/Z_L$. As will be appreciated by those in the art negative inductance can be realized in a variety if ways. For example, over a limited bandwidth a shunt capacitance is equivalent to a negative inductance.

Figure 6:
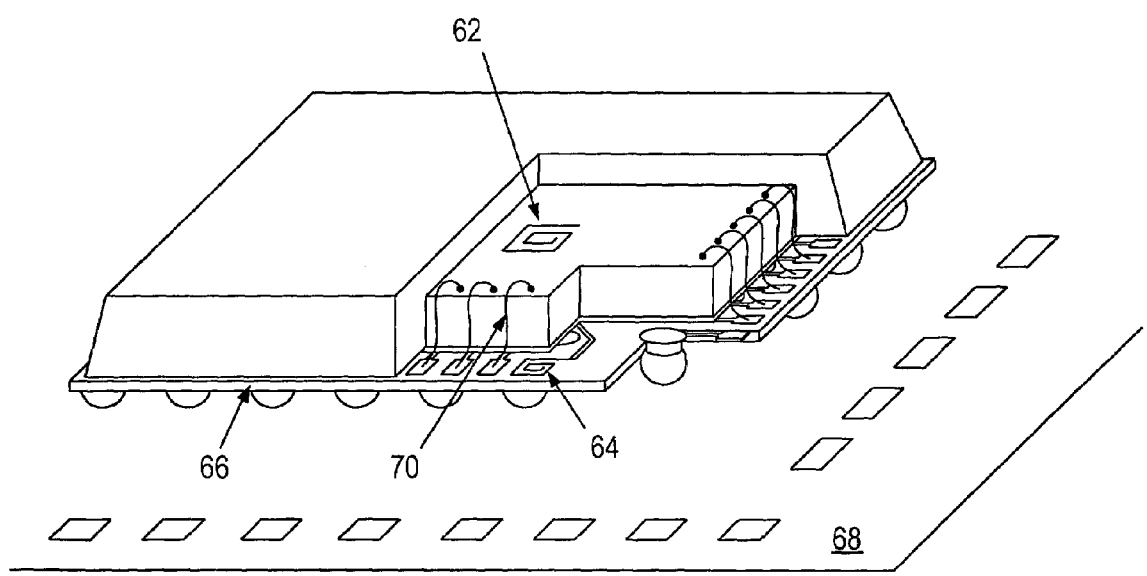
FIG. 6 depicts the physical layout of the impedance inverter of FIG. 5.

Advantageously, the positive inductance of the impedance inverter of FIG. 5 is realized as one or more wire bonds in accordance with the invention. As illustrated by FIG. 6, the series inductor 58 is provided by the inductance of wire bond 70, wherein the exact configuration (i.e. shape, length, thickness) of the wire bond (or wire bonds, as the case may be) is pre-determined so as to satisfy the design criteria needed to provide to the impedance inverter circuit, in operation, the required positive inductance. The two shunt negative inductances 60 can be provided by an on-die component, as shown by the spiral inductor 62, and/or by an off-die component, as shown by the spiral inductor 64. As will be understood by those in the art, the off-die component can be positioned on the package 66 or on the printed circuit board 68 to which it is electrically coupled. As will also be understood by those in the art, FIG. 6 is not to scale and does not depict the electrical tracks connecting the components described above.

A lumped element impedance inverter as described in relation to FIGS. 5 and 6 can be integral to a more elaborate electrical circuit such as the circuit described in Applicant's co-pending continuation-in-part application filed on the same date as this application which is a continuation-in-part of Ser. No. 10/004,703 now issued U.S. Pat. No. 6,603,352 entitled "Switched-Mode Power Amplifier Integrally Performing Power Combining" filed on 3 Dec. 2001, which is incorporated herein by reference. It will also be understood by those skilled in the art that the inductance associated with a wire bond could be advantageously incorporated into other circuitry such as a discrete filter.

As will be understood by those skilled in the art, the present invention relates to integrated circuits in which a wire bond is used in combination with other components to form a useful circuit function for either analog or digital chips. The individual electronic and processing functions utilised in the foregoing described embodiment are, individually, well understood by those skilled in the art. It is to be understood by the reader that a variety of other implementations may be devised by skilled persons for substitution and the claimed invention herein is intended to encompass all such alternative implementations, substitutions and equivalents. Persons skilled in the field of electronic and communication design will be readily able to apply the present invention to an appropriate implementation for a given application.

Consequently, it is to be understood that the particular embodiments shown and described herein by way of illustration are not intended to limit the scope of the invention claimed by the inventors/assignee which is defined by the appended claims.

We claim:

1. An integrated circuit package comprising:
    an integrated circuit die having at least one integrated circuit and a first negative-inductance shunt element
    a housing containing said integrated circuit die, wherein said integrated circuit die is electrically coupled to said housing using at least one wire bond; and
    an impedance inverter circuit including the first negative-inductance shunt element, the at least one wire bond, and a second negative-inductance shunt element coupled to the integrated circuit die through the at least one wire bond.

2. The integrated circuit of claim 1, wherein at least one of the first negative-inductance shunt element and the second negative-inductance shunt element has a negative inductance only over a limited bandwidth.

3. The integrated circuit of claim 2, wherein at least one of the first negative-inductance shunt element and the second negative-inductance shunt element having the negative inductance only over the limited bandwidth includes a capacitor configured to have the negative inductance only over the limited bandwidth.

4. The integrated circuit of claim 1, wherein the second negative-inductance shunt element is external to the housing.

5. An integrated circuit package comprising:
an integrated circuit die having at least one integrated circuit, the integrated circuit comprising elements that require theoretically negative reactive component values;
a housing containing said integrated circuit die, wherein said integrated circuit die is electrically coupled to said housing using at least one wire bond; and where the at least one wire bond has an inductance associated therewith, and comprises a series inductor of a series inverter portion of an impedance inverter circuit; and wherein the negative reactive component values theoretically required by the integrated circuit are incorporated into the integrated circuit through the use of the impedance inverter circuit;
a first inductor electrically coupled to the series inverter portion at a first node, wherein the first inductor is arranged in a shunt arrangement; and
a second inductor electrically coupled to the series inverter portion at a second node, wherein the second inductor is arranged in a shunt arrangement.

6. The integrated circuit package of claim 5, wherein at least one of the said first and second inductors are formed external to said integrated circuit die.

7. The integrated circuit package of claim 5, wherein one of said first and second inductors is formed external to said integrated circuit die and the other of said first and second inductors is formed integrally with said integrated circuit die.

8. The integrated circuit package of claim 5, wherein each of said first and second inductors is formed integrally with said integrated circuit die.

9. The integrated circuit package of claim 5, wherein each of said first and second inductors include a spiral inductor.

10. The integrated circuit package of claim 5, wherein said series inductor, said first and said second inductors are part of the impedance inverter, the impedance inverter adapted to transform a lower output impedance into a higher output impedance.

11. The integrated circuit package of claim 5, wherein at least one of said first and second inductors has a negative inductance.

12. The integrated circuit package of claim 5, wherein at least one of said first and second inductors are formed external to the housing.

13. An integrated circuit package comprising:
an integrated circuit die having at least one integrated circuit, the integrated circuit comprising elements that require theoretically negative reactive component values;
a housing containing said integrated circuit die, wherein said integrated circuit die is electrically coupled to said housing using at least one wire bond; and where the at least one wire bond has an inductance associated therewith; and
means for incorporating the negative reactive component values into the integrated circuit, the means for incorporating the negative reactive component values including:
a series inverter portion including the at least one wire bond as a series inductor;
a first inductor electrically coupled to the series inverter portion at a first node, wherein the first inductor is arranged in a shunt arrangement; and
a second inductor electrically coupled to the series inverter portion at a second node, wherein the second inductor is arranged in a shunt arrangement.

14. The integrated circuit package of claim 13, wherein at least one of said first and second inductors are formed external to said integrated circuit die.

15. The integrated circuit package of claim 13, wherein one of said first and second inductors is formed external to said integrated circuit die and the other of said first and second inductors is formed integrally with said integrated circuit die.

16. The integrated circuit package of claim 13, wherein each of said first and second inductors is formed integrally with said integrated circuit die.

17. The integrated circuit package of claim 13, wherein each of said first and second inductors include a spiral inductor.

18. The integrated circuit package of claim 13, wherein the means for incorporating the negative reactive component values into the integrated circuit is adapted to transform a lower output impedance into a higher output impedance.

19. The integrated circuit package of claim 13, wherein at least one of said first and second inductors has a negative inductance.

20. The integrated circuit package of claim 13, wherein at least one of said first and second inductors are formed external to the housing.

* * * * *